US008772170B2

(12) United States Patent
Raghavan et al.

(10) Patent No.: US 8,772,170 B2
(45) Date of Patent: Jul. 8, 2014

(54) ENHANCED STRIPPING OF IMPLANTED RESISTS (75) Inventors: Srini Raghavan, Tucson, AZ (US); Rajkumar Govindarajan, Tucson, AZ (US); Manish Keswani, Tucson, AZ (US)

(73) Assignee: Arizona Board of Regents on Behalf of the University of Arizona, Tucson, AZ (US)

( * ) Notice: Subject to any disclaimer, the term of this patent is extended or adjusted under 35 U.S.C. 154(b) by 361 days.

(21) Appl. No.: 12/981,073

(22) Filed: Dec. 29, 2010

(65) Prior Publication Data

US 2012/0052687 A1 Mar. 1, 2012

Related U.S. Application Data (60) Provisional application No. 61/402,557, filed on Sep. 1, 2010.

(51) Int. Cl.
*H01L 21/302* (2006.01)

(52) U.S. Cl.
USPC .......................................................... 438/705

(58) Field of Classification Search
None
See application file for complete search history.

(56) References Cited

U.S. PATENT DOCUMENTS

| 6,848,455 | B1 * | 2/2005 | Shrinivasan et al. | 134/1.3 |
| 2007/0227556 | A1 * | 10/2007 | Bergman | 134/3 |
| 2009/0170029 | A1 * | 7/2009 | Choi et al. | 430/285.1 |

OTHER PUBLICATIONS

Christenson, K. K., et al., "Wet Resist Strip Capability vs. Implant Energy," 2007, ECE Transactions, The Electrochemical Society, vol. 11, No. 2, pp. 197-202.
Christenson, K. K., et al., "All Wet Stripping of Implanted Photoresist," 2008, Solid State Phenomena, vol. 134, pp. 109-112.
DeKraker, D., et al., "Steam-Injected SPM Process for All-Wet Stripping of Implanted Photoresist," 2008, UCPSS Proceedings, Solid State Phenomena vols. 146-146, 277(2009).
Govindarajan, R., et al., "Effect of Pretreatment of High Dose Implanted Resists by Activated Hydrogen Peroxide Chemical Systems for their Effective Removal by Conventional Sulfuric-Peroxide Mixtures," 2011, IEEE (available online for pre-publication).
Neyens, E., et al., "A review of classic Fenton's peroxidation as an advanced oxidation technique," 2003, Journal of Hazardous Materials B98, pp. 33-50.
Neyens, E., et al., "Pilot-scale peroxidation ($H_2O_2$) of sewage sludge," 2003, Journal of Hazardous Materials B98, pp. 91-106.
Raghavan, S., et al., "Thermal and Chemical Characteristics of SPM Systems for Resist Stripping Applications," 2008, SEMICON Korea, SEMI Technology Symposium (STS), pp. 223-227.
Sapach, R., et al., "An introduction to the Use of Hydrogen Peroxide and Ultraviolet Radiation: An Advanced Oxidation Process," 1997, J. Environ. Sci. Health, vol. A32, No. 8, pp. 2355-2366.

(Continued)

*Primary Examiner* — Duy Deo
*Assistant Examiner* — Bradford Gates
(74) *Attorney, Agent, or Firm* — Saliwanchik, Lloyd & Eisenschenk (57) ABSTRACT A benign all-wet process for stripping photoresist after an implantation process performed to fabricate a device is provided. A method of stripping implanted resist includes a first step of disrupting a crust formed on the surface of the resist during the implantation process and then removing the underlying resist. In accordance with embodiments of the invention, a catalyzed hydrogen peroxide (CHP) chemical system is used to disrupt the crust and allow for low temperature (<180° C.) removal of the underlying resist.

19 Claims, 7 Drawing Sheets

(56) References Cited

OTHER PUBLICATIONS

Takahashi, H., "Plasma-less photoresist stripping," 2007, ECE Transactions, The Electrochemical Society, vol. 11, No. 2, pp. 189-195.
Visintin, P., et al., "Liquid Clean Formulations for Stripping High-Dose Ion-Implanted Photoresist from Microelectronic Devices," 2006, Journal of The Electrochemical Society, vol. 153, No. 7, pp. G591-G597.
Watts, R. J., et al., "Enhanced stability of hydrogen peroxide in the presence of subsurface solids," 2007, Journal of Contaminant Hydrology, vol. 91, pp. 312-326.
Yamamoto, M., et al., "Removal of Ion-Implanted Photoresists Using Wet Ozone," 2009, Journal of The Electrochemical Society, vol. 156, No. 7, pp. H505-H511.

* cited by examiner

Blanket PR

FIG. 4A

PR in 2:1 SPM

FIG. 4B

PR in CHP

FIG. 4C

PR in CHP followed by SPM

5 minutes UV exposure + UV/H$_2$O$_2$ treatment

FIG. 8A 10 minutes UV exposure + UV/H$_2$O$_2$ treatment

FIG. 8B

ENHANCED STRIPPING OF IMPLANTED RESISTS

CROSS-REFERENCE TO RELATED APPLICATION

This application claims the benefit of U.S. Provisional Application Ser. No. 61/402,557, filed Sep. 1, 2010, which is hereby incorporated by reference in its entirety.

BACKGROUND OF THE INVENTION

Photoresist is typically employed as block mask during ion implantation for front-end-of-line (FEOL) CMOS device processing. The block mask of the photoresist is used to selectively allow ions being implanted across an entire wafer to penetrate into desired regions of the substrate. Once the implantation process is performed, the photoresist is removed from the wafer.

Removal of resists exposed to ions during this processing is currently carried out by an oxygen plasma ash method followed by a wet stripping (or cleaning) process. The follow-up wet stripping is performed to remove resist particulate that remains on the wafer after the dry stripping (oxygen plasma asking). In addition to causing particulate contamination, the dry stripping methods using oxygen plasma may also cause silicon loss. Current wet cleaning methods based on high temperature (>180° C.) sulfuric acid-peroxide mixtures (SPM) claim to remedy the particulate contamination and silicon loss of the dry stripping method. However, the high temperature and extreme low pH conditions used in SPM based resist stripping pose a serious safety concern.

In addition these high temperature SPM wet cleaning methods have varying degrees of effectiveness in removing carbonized crusts formed in resists implanted at dosages $\geq 10^{16}/cm^2$. In particular, high dose implants damage the upper layer of a photoresist, forming a cross-linked (carbonized) crust layer. Not only is the crust layer very difficult to remove using wet chemical based processes, but removing the crust by undercutting of the undamaged or lightly damaged regions of photoresist can result in defects on the wafer due to re-deposition of fragments from the crust. In addition, the part of the crust in contact with the silicon near the edge bead removal region (EBR) remains unaffected in many wet chemical systems.

Very hot (>200° C.) SPM, generated at the wafer level, has shown some promise in attacking the crust and stripping the resist; however, hot SPM is not compatible with metal gates used in a number of current devices.

Thus, there is a continued need in the art for effective photoresist removal.

BRIEF SUMMARY OF THE INVENTION

Embodiments of the invention relate to photoresist removal. Specific embodiments can be implemented in semiconductor fabrication processes, including but not limited to CMOS processes. In accordance with an embodiment of the invention, a lower temperature wet stripping method is used to remove photoresist.

According to one embodiment, a photoresist removal process utilizes catalyzed hydrogen peroxide to disrupt the carbonized crust that forms on deep UV resist layers that are exposed to high dose ions when the resist is used as an implantation mask. The photoresist removal process further removes the resist using a wet chemical strip at a temperature of less than 180° C. The wet chemical strip can be an SPM process.

By using a lower temperature process, the subject removal process can avoid problems associated with high temperature SPM processes. In addition, certain embodiments of the invention may replace the conventional ash/-strip process in CMOS device processing.

Eliminating the ash and reducing the temperature of the wet chemical strips could potentially reduce the energy footprint of the strip and simultaneously reduce the number of process steps.

BRIEF DESCRIPTION OF THE DRAWINGS

FIGS. 2A-2D show optical microscopic images (magnification 1000×) of amorphous carbon films, used as model compounds for a carbonized crust, after CHP treatment (all solutions contained 20% $H_2O_2$).

FIGS. 3A-3C show cross section of implanted ($10^{16}$ $As/cm^2$) photoresist films.

FIGS. 4A-4D show confocal microscopic images (magnification 14 Kx) of implanted photoresist after different treatments.

FIGS. 6A and 6B show 3D confocal images and a line scan of a removal region of the substrate after different treatments under spin condition (Area analyzed: 125×125 μm).

DETAILED DISCLOSURE OF THE INVENTION

Photoresist removal processes and chemical systems for removing photoresist are provided. Embodiments of the invention utilize catalyzed hydrogen peroxide decomposition/activation to attack the organic compounds found in the carbonized crust formed on implanted resists.

Hydrogen peroxide on its own is a relatively weak oxidant, but can form very powerful oxidants on activation. In particular, the —O—O— bond in hydrogen peroxide is relatively weak and is susceptible to homolysis by metal redox reaction. For example, the use of iron as the metal results in iron catalyzed hydrogen peroxide decomposition, which is also referred to as Fenton's reaction. Fenton's reaction is typically achieved by using one part of iron to 5-25 parts of $H_2O_2$ (wt/wt), with iron level less than 20 ppm. For Fenton's chemistry, which is the reaction of iron catalyzed peroxide decomposition at pH 3-5, hydrogen peroxide concentration ranging from 2.5 mM to 15 mM is widely used. The Fenton's reaction produces radicals (OH., $HO_2$.), which are strong oxidants, according to following reactions:

$$Fe^{2+} + H_2O_2 \rightarrow Fe^{3+} + OH. + OH^-$$

$$Fe^{3+} + H_2O_2 \rightarrow Fe^{2+} + OOH. + H^+$$

As indicated by the above reactions, Iron (II) is oxidized by hydrogen peroxide to iron (III), a hydroxyl radical, and a hydroxide anion. Iron (III) is then reduced back to iron (II), a hydroperoxide radical and a proton by the same hydrogen peroxide (disproportionation reaction).

Catalyzed $H_2O_2$ Propagation (CHP) or Modified Fenton's reagent uses higher concentrations of $H_2O_2$ (~2-25%), resulting in the formation of perhydroxyl radical ($HO_2$.—weak oxidant), superoxide radical anion ($O_2.^-$—nucleophile), and hydroperoxide anion ($HO_2^-$—strong nucleophile) as shown below:

$$OH. + H_2O_2 \rightarrow HO._2 + H_2O$$

$$HO._2 \rightarrow O_2.^- + H^+$$

$$HO._2 + Fe^{2+} \rightarrow HO_2^- + Fe^{3+}$$

The co-existence of the neutral and anionic radical species can provide highly oxidizing conditions to attack organic compounds.

Current semiconductor device fabrication processes, including CMOS processes, often utilize a photoresist pattern on the substrate as an implant mask to expose certain regions of the substrate for implantation while protecting covered regions of the substrate. The photoresist may form an organic (carbonized) crust during the implant process that is difficult to remove using conventional photoresist striping processes. Accordingly, one implementation of the subject invention removes photoresist from a substrate by utilizing a CHP chemical system to pretreat the photoresist implant mask and then performing a lower temperature (<180° C.) wet etch. For example, referring to FIG. 1, according to an embodiment of the invention, a substrate can be implanted with ions through one or more ion implant processes S100 using a photoresist pattern as an ion implant mask. The ion implant processes S100 can be any appropriate implant process known in the art. In addition, the ion species being implanted can be one or more appropriate ions (including complex or compound ions) for a particular structure and design, including but not limited to arsenic, phosphorus, boron, boron difluoride, indium, antimony, germanium, silicon, nitrogen, hydrogen, and helium.

Figure 1:
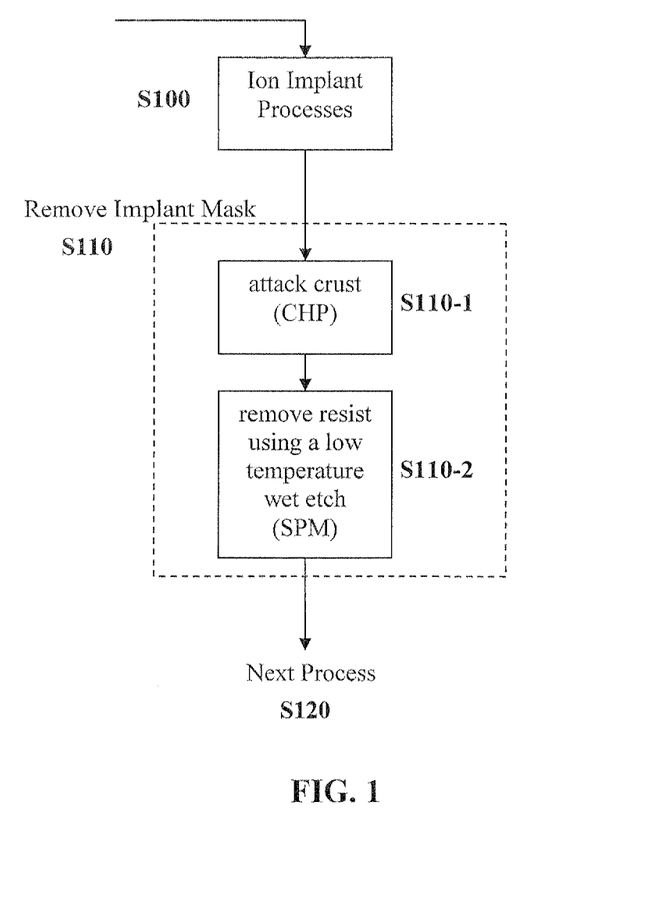
FIG. 1 shows a block diagram of a method of fabricating a device, including removal of a photoresist implant mask in accordance with an embodiment of the present invention.

After performing the ion implant processes, the photoresist implant mask is removed S110. In accordance with embodiments of the invention, the removal of the implant mask has two stages. The first stage S110-1 involves disrupting any crust that forms on the photoresist due to the implanting process. This stage subjects the wafer to a CHP chemical system. For example, the wafer can be immersed in a CHP solution or exposed to solution or aerosolized spray (including mists, droplets, atomized solution, etc.) while the wafer is moving by, for example, being spun (e.g., spin processing). In spin processing, the wafer can be set on a base having a motor. The wafer can be releasably held to the base by a vacuum chuck. Once the wafer begins to spin, the CHP solution can be dispensed onto the spinning wafer. The CHP solution can be selected for optimizing crust removal for the particular resist being removed. According to one embodiment, the CHP solution can have a pH within the range of 2-5. In addition, the $H_2O_2$ concentration can be 5%-30% and the $Fe^{2+}$ concentration can be 1 mM to 10 mM. In certain embodiments, $H_2O_2$ concentration can be 10%-25%, and even 5%-25%, Also, for embodiments of the invention incorporating UV decomposition, $Fe^{2+}$ concentration can be 0 mM to 10 mM and $H_2O_2$ concentration can be as low as about 5%. The $Fe^{2+}$ concentration can depend on the use of radiation (such as UV) for catalytic formation, and $Fe^{2+}$ may be omitted in certain cases using such a radiative catalyst. According to one particular embodiment used in an example implementation, the CHP solution can have a pH of about 2.8 with about 20% $H_2O_2$ and 5 mM of $Fe^{2+}$. Of course, this example should not be construed as limiting.

After disrupting the crust, the resist can be removed using a low temperature (less than 180° C.) wet etch S110-2. In certain embodiments, the temperature that the wet stripping method is carried out is 150° C. or less or 120° C. or less. In other embodiments temperatures of less than 100° C., and even less then 80° C., are used.

The etchant can be a conventional SPM solution. According to one embodiment, SPM can be used having a ratio of 2:1 sulfuric acid to hydrogen peroxide. The application of the SPM can be via immersion or spin cleaning. For spin cleaning, sulfuric acid of the SPM is mixed with cold peroxide before application to a spinning wafer. When the sulfuric acid is at room temperature, the spin cleaning is carried out at temperatures of between 80° C. and 100° C. In certain embodiments, the SPM can be preheated to about 80° C. before contacting the wafer. When the sulfuric acid of the SPM is preheated to about 80° C., a temperature of about 120° C. can be achieved for the cleaning process upon mixing with the peroxide. By preheating the sulfuric acid before mixing with hydrogen peroxide, temperatures as high as 150° C.-160° C. can be achieved. For high temperature cleaning methods, an additional steaming process is used to bring the SPM to temperatures of 180° C. to over 200° C.

Once the implant mask removal processes S110-1 and S110-2 are completed, subsequent processes S120 can be performed. For each subsequent photolithography and implant process, the subject implant mask removal process S110 can be repeated. In certain embodiments, the subject removal process of S110-1 and S110-2 can be used to remove resist that has not been subjected to ions when used as an implant mask (e.g., for mask patterns used primarily for etching steps).

The subject photoresist removal process can be particularly useful for removing DUV resists that have been subject to high ion implant doses of greater than $10^{15}/cm^2$, and particularly greater than $10^{16}/cm^2$.

As mentioned above, stripping of photoresists (PR) exposed to doses of higher than $10^{15}/cm^2$ ion beams is one of the most challenging steps in FEOL processing. This is due to the refractory crust that forms on the resist surface during ion implantation. The particular ion dose that causes the cross-linking and crust formation on the photoresist can be dopant and implantation angle dependent. Conventional dry stripping methods using oxygen plasma cause particulate contamination and silicon loss and need a follow-up wet cleaning step. In addition, the current all-wet methods are based on very hot sulfuric acid-hydrogen peroxide mixtures and pose significant safety and energy issues.

Accordingly, embodiments of the invention provide a low temperature all-wet benign process for the stripping of implanted resists. Particular implementations use a catalyzed hydrogen peroxide chemical system at temperatures of less than 180° C. for disrupting the crust formed on the resist surface so that the underlying resist layer can be removed. In certain embodiments, the CHP chemical system can be implemented at room temperature (~20-27° C.). In addition, a follow-up SPM strip to remove the underlying resist layer can be applied at temperatures of less than 180° C. and even less than 80° C.

By using a lower temperature process, the subject removal process can avoid problems associated with high temperature SPM processes. In addition, certain embodiments of the invention may replace the conventional ash/-strip process in CMOS device processing.

Eliminating the ash and reducing the temperature of the wet chemical strips could potentially reduce the energy footprint of the strip and simultaneously reduce the number of process steps.

In the CHP chemical system, exposure/interaction time and hydrogen peroxide and catalyst concentration can be adjusted for optimization. Although the use of iron as a catalyst is described in detail herein, other catalysts may be used. For example, by adjusting the concentration and exposure/interaction time, non-metal catalysts, such as borates; radiative catalysts, such as UV light; and non-radiative catalysts, such as sonic waves (including ultrasonic and megasonic), can be used.

For example, in one embodiment using a radiative catalyst, the CHP chemical system can be hydrogen peroxide with a concentration of 5-25% that is subjected to UV radiation for a predetermined period of time.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

To illustrate the subject CHP chemical system-based photoresist removal, experiments were conducted using an amorphous carbon film and a photoresist film implanted with arsenic at an ion dose of $10^{16}/cm^2$.

Methods and Materials for Examples

For the amorphous carbon cleaning studies, the amorphous carbon was in the form of ~900 Å films formed by RF decomposition of $C_2H_2$, and the wafers having the amorphous carbon were diced to 1 cm×1 cm.

For the implanted PR cleaning studies, resist films were used of thickness ~1.5 μm exposed to arsenic ion dose of $10^{16}/cm^2$, and the wafers having the implanted photoresist were diced to 1 cm×1 cm.

The CHP solution included Ferrous Sulfate ($FeSO_4 \cdot 6H_2O$; 99.998% pure), Hydrogen Peroxide (30 wt %) and Sulfuric acid (96%). Sulfuric acid and ammonium hydroxide were used to adjust the pH of CUP solutions. The SPM solution included Hydrogen Peroxide (30 wt %) and Sulfuric acid (96%).

Stripping/removal experiments were conducted using immersion (static) and spin (dynamic) cleaning methods. In the case of the immersion technique, the cleaning solution (25 ml) was kept unstirred whereas the PR spin speed was maintained constant at 100 rpm for all spin cleaning experiments. All the samples were rinsed with DI water for 2 minutes before and after each cleaning, step. A Laurell spin coater was used for conducting spin cleaning experiments. CHP solution was dispensed at 15 ml/min. In the case of SPM solution, $H_2O_2$ (15 ml/min, <10° C.) and $H_2SO_4$ (30 ml/min) preheated to 80° C. were mixed just before dispensing on the spinning resist samples mounted on a silicon wafer. This procedure allows higher SPM temperatures (up to 120° C.) at point of mixing, which has shown to increase the activity of SPM compared to the case where the solutions are pre-mixed at room temperature much before dispensing.

Morphological changes after CHP and SPM treatments were characterized using Leica DM4000B microscope operated using QCapture Pro 5.0 software, Leeds Confocal microscope operated with LEXT OLS software, and Hitachi 54800 FESEM. Chemical characterization of samples was done with a KRATOS Axis Ultra 165 X-ray photoelectron spectrometer using Al Kα X-ray radiation (1486.6 eV).

Example 1

Effectiveness in Attacking Amorphous Carbon Films

Figure 2A:
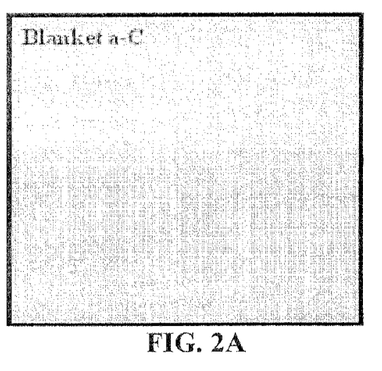
FIG. 2A shows a blanket carbon film before processing.
Figure 2B:
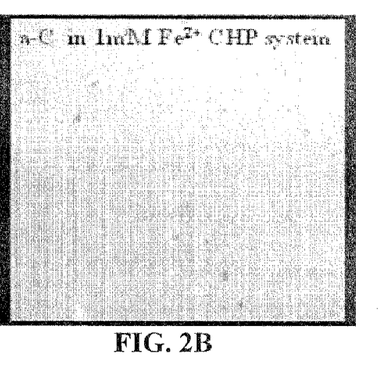
FIG. 2B shows the blanket carbon film after treatment in 1 mM $Fe^{2+}$ CHP chemical system.
Figure 2C:
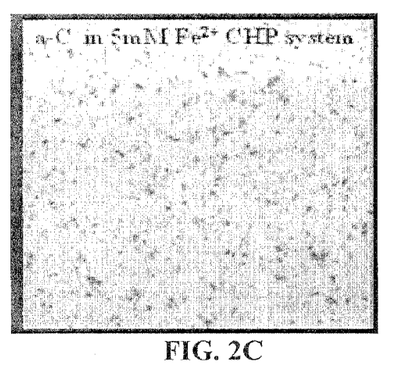
FIG. 2C shows the blanket carbon film after treatment in 5 mM $Fe^{2+}$ CHP chemical system.
Figure 2D:
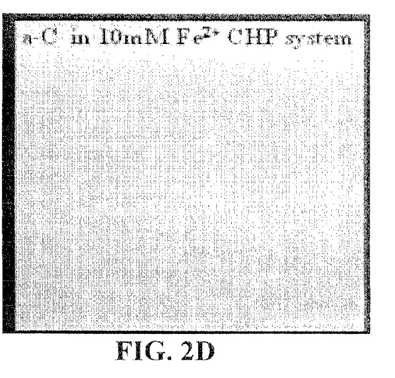
FIG. 2D shows the blanket carbon film after treatment in 10 mM $Fe^{2+}$ CHP chemical system.

Attack of amorphous carbon films was investigated by immersing the carbon films in CHP solution for 30 minutes at room temperature followed by rinsing in DI water. It is believed that the carbonized crust on photoresist is amorphous carbon. Accordingly, amorphous carbon was used in the initial experiments. The films were then immersed in HCl (1 M) for 2 minutes to remove residual iron. CHP solutions (pH~2.8) containing 20% $H_2O_2$ and different $Fe^{2+}$ levels (1 mM, 5 mM, 10 mM) were used to compare the effects of $Fe^{2+}$ levels on the ability to attack the carbon film. FIGS. 2A-2D illustrate the results of this test. Specifically, FIGS. 2A-2D show optical microscopic images (magnification 1000×) of amorphous carbon films after CHP treatment where FIG. 2A shows a blanket carbon film before processing, FIG. 2B shows the blanket carbon film after treatment in 1 mM $Fe^{2+}$ CHP chemical system, FIG. 2C shows the blanket carbon film after treatment in 5 mM $Fe^{2+}$ CHP chemical system, and FIG. 2D shows the blanket carbon film after treatment in 10 mM $Fe^{2+}$ CHP chemical system.

As can be seen from FIGS. 2A-2D, localized attack is a function of $Fe^{2+}$ level. Referring to FIG. 2C, it can be seen that the presence of 5 mM $Fe^{2+}$ ions created many pores in amorphous carbon films compared to 1 mM $Fe^{2+}$ (FIG. 2B) and 10 mM $Fe^{2+}$ (FIG. 2D) levels. Although not shown in the figures, it was observed that adjusting the pH of CHP solution to 1 and 6 resulted in poor disruption of the carbon film. Distribution of pores (the disruption in the carbon film) due to a pH of 1 and 6 was similar to that of films treated with CHP containing 1 mM $Fe^{2+}$ and 10 mM $Fe^{2+}$ ions. Therefore, based upon these tests CHP at pH 1 and 6 are inefficient in disrupting the carbon film.

In order to compare the effect of SPM against CHP, amorphous carbon films were immersed in 2:1 SPM at 80° C. for 5 minutes. Although not shown in the figures, SPM was found to be not effective on amorphous carbon as no attack/disruption was observed.

Example 2

Effectiveness of Photoresist Removal

Figure 3A:
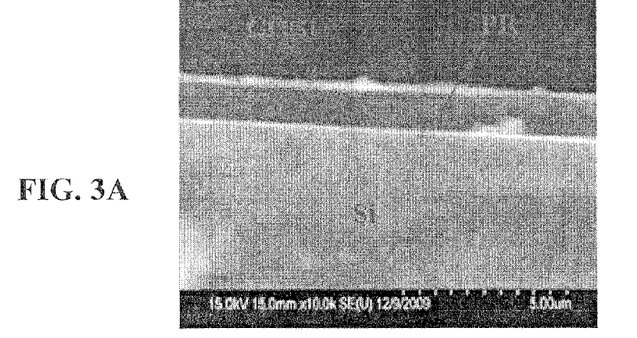
FIG. 3A shows a blanket photoresist film on a silicon substrate.
Figure 3B:
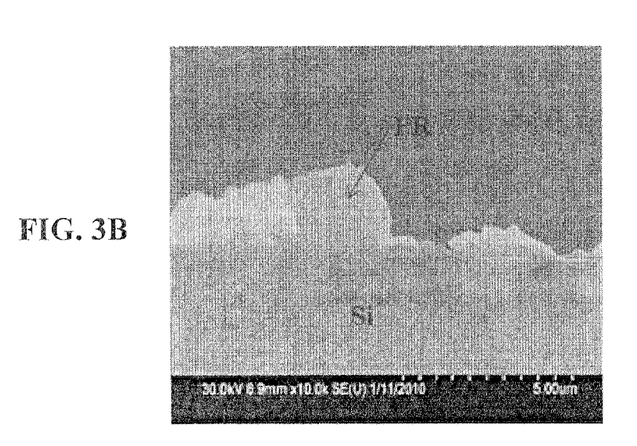
FIG. 3B shows the photoresist film after application of only (2:1) SPM.
Figure 3C:
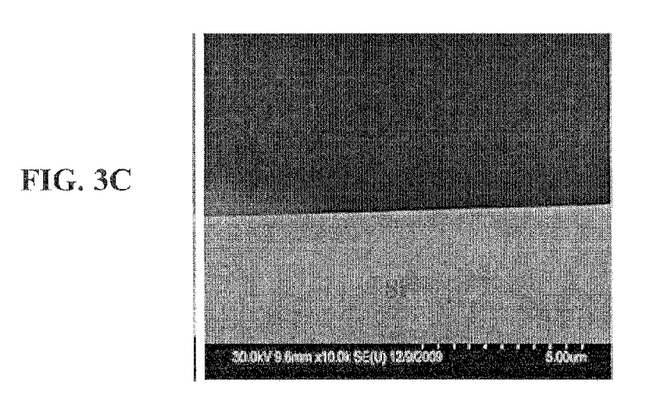
FIG. 3C shows the substrate after the photoresist film is pretreated with CHP followed by application of 2:1 SPM.

Field Emission SEM was used to characterize the response of implanted resist films to treatment in 2:1 SPM before and after treatment in CHP. FIGS. 3A-3C show cross-sectional FESEM images of ($10^{16}$ As/cm$^2$) implanted PR after different treatments. Specifically, FIG. 3A shows a blanket photoresist film on a silicon substrate, FIG. 3B shows the substrate after a photoresist film is immersed only in (2:1) SPM, and FIG. 3C shows the substrate after a photoresist film is pretreated with CLIP followed by immersion in 2:1 SPM. Referring to FIG. 3A, blanket PR showed crust layer of thickness ~400 nm. Upon treatment in 2:1 SPM for 5 minutes, the resist film shows poor removal, as seen in FIG. 3B. However, as shown in FIG. 3C, excellent removal of high dose implanted PR is possible by first exposing the resist to CHP solution containing 5 mM $Fe^{2+}$ and 20% $H_2O_2$ for 15 minutes followed by 5 minutes immersion in 2:1 Sulfuric acid-Peroxide Mixture (SPM) at 80° C.

Figure 4A:
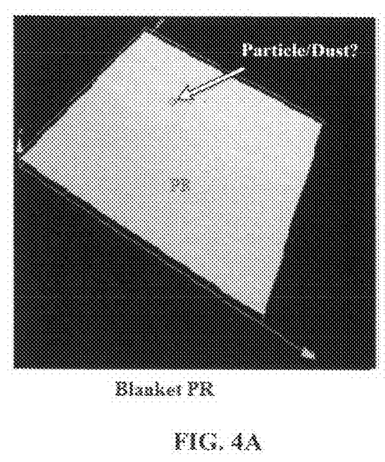
FIG. 4A shows a blanket implanted photoresist film before processing.
Figure 4B:
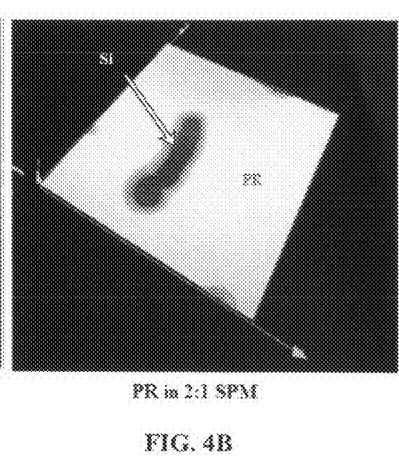
FIG. 4B shows the substrate after the photoresist film is treated with only (2:1) SPM under spin conditions.
Figure 4C:
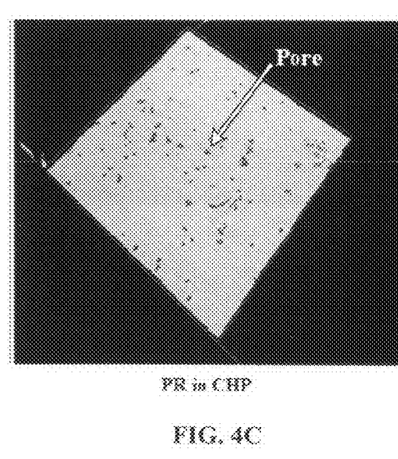
FIG. 4C shows the substrate after the photoresist film is treated with CHP under spin conditions.
Figure 4D:
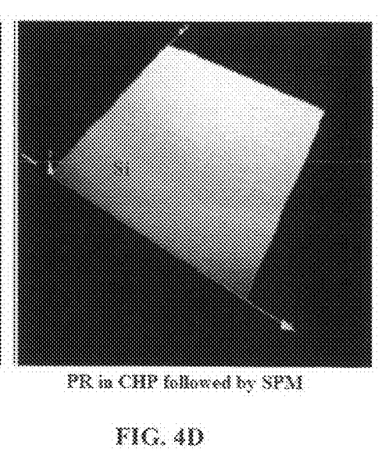
FIG. 4D shows the substrate after the photoresist film is pretreated with CLIP followed by application of SPM under spin conditions.

The effect of CHP and SPM on photoresist removal under spin cleaning conditions was analyzed using confocal microscopy. FIGS. 4A-4D show 3D confocal images obtained on a sample representative of five different 125×125 µm regions. Two regions were close to the edge and three regions were near the center. As shown in FIG. 4A, blanket PR is smooth without any pores. Upon SPM treatment, as shown in FIG. 4B, PR removal occurs; however, PR remains across a large portion of the silicon substrate. In the case of CHP treatment, as shown in FIG. 4C, localized attack throughout the surface may be seen (referred to as pores). As shown in FIG. 4C, the two step process involving CHP exposure followed by SPM treatment results in very good removal of PR (confirmed by line scan and extent of resist removal).

Figure 5:
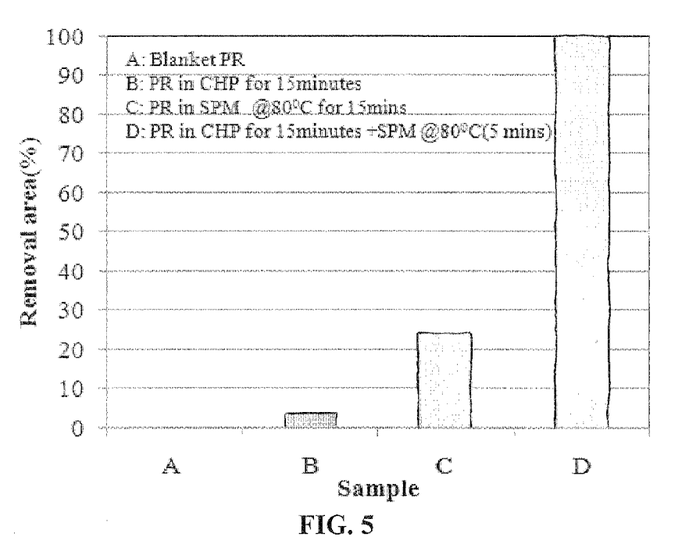
FIG. 5 shows a plot of removal area % of implanted PR according to treatment.
Figure 6A:
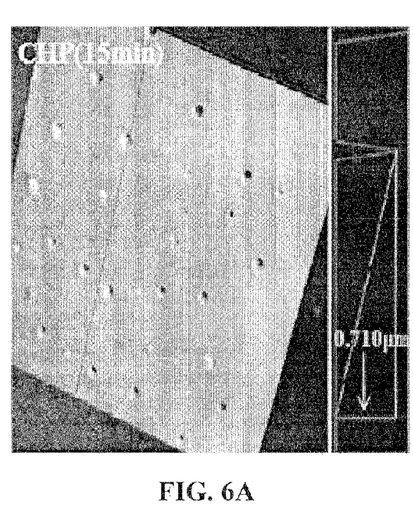
FIG. 6A shows the substrate after treatment of the photoresist film with CLIP for 15 minutes and FIG. 6B shows the substrate after pretreatment of the photoresist film with CHP for 15 minutes and SPM immersion for 5 minutes.
Figure 6B:
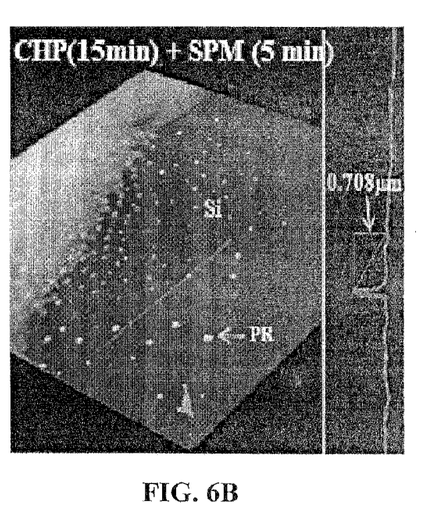

Extent of resist removal (based on area cleared) and pore depth were measured using LEXT OLS software available on the confocal microscope. The CHP treatment was found to create pores of depth ~700 nm and size ~1.5 µm. In contrast, the SPM treatment performed alone is predominately ineffective due to the SPM treatment penetrating the crust to remove the resist at only a few regions. The calculated extent of removal is plotted in FIG. 5. While the CHP by itself does not remove much of the resist, the two step process results in an almost complete removal of the implanted resist. In particular, FIG. 6A shows a 3D confocal image and line scan of the substrate after treatment of the photoresist film with CHP for 15 minutes and FIG. 6B shows a 3D confocal image and line scan of the substrate after pretreatment of the photoresist film with CHP for 15 minutes and SPM immersion for 5 minutes. The removal mechanism appears to involve random attack of the cross-linked crust by oxidizing radicals present in CHP, resulting in the formation of pores. Access to SPM is provided by these pores resulting in stripping of the entire resist layer.

Figure 7:
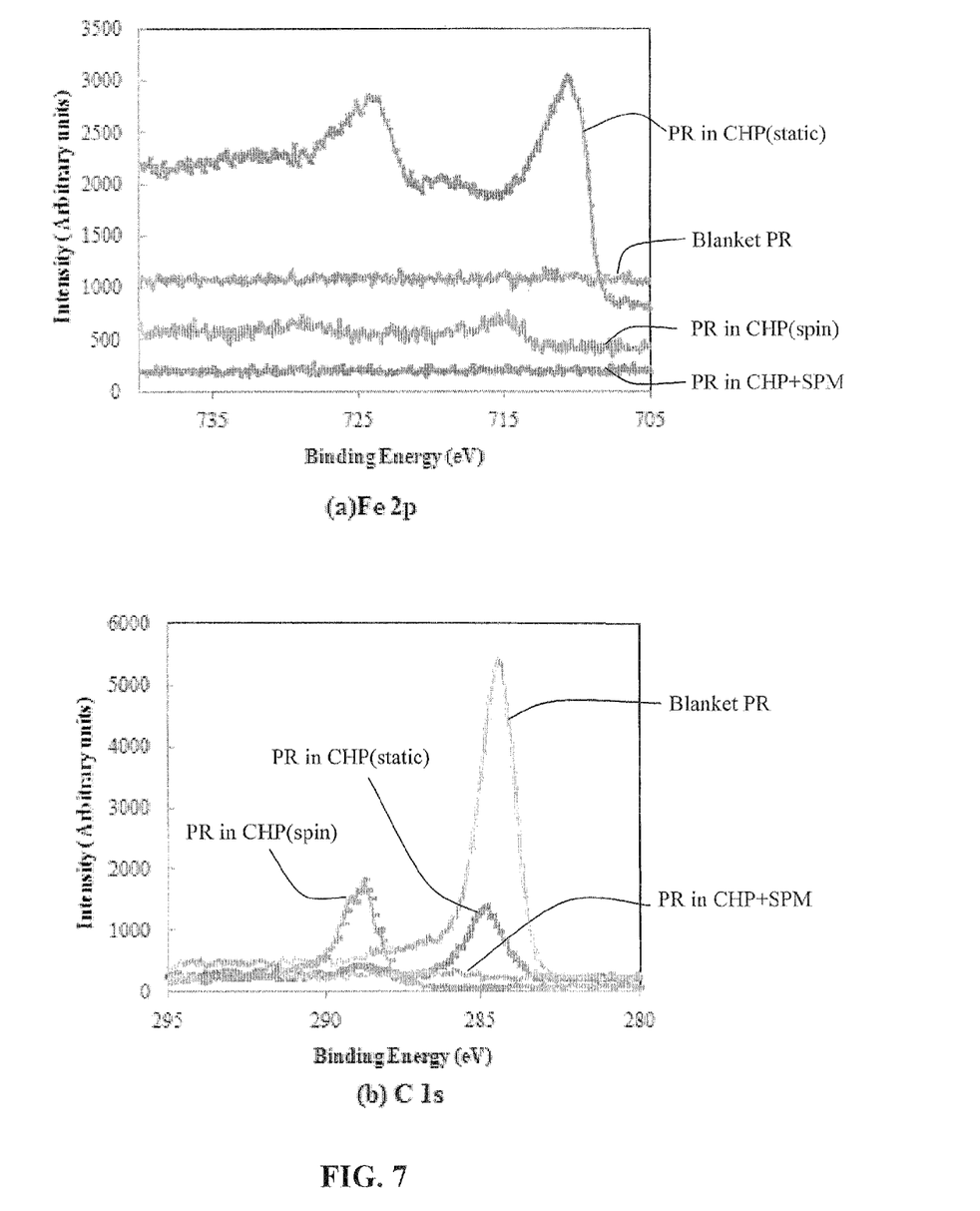
FIG. 7 shows X-ray photoelectron spectroscopy analysis of an implanted blanket photoresist after treatment showing a) Fe 2p and C 1s peaks.

FIG. 7 shows a) Fe 2p and b) C 1s regions in the XPS spectrum of implanted PR after different treatments. A comparison is made for the blanket PR, the PR after CHP is applied by spin cleaning, the PR after static CHP immersion, and the PR after the CHP and SPM process. Referring to (a), it can be seen that no iron peaks were present in the blanket PR film (Blanket PR) and the PR film exposed to CHP followed by SPM under spin cleaning conditions (PR in CHP+SPM). In the case of CHP immersion treated sample (PR in CHP (static)), simple immersion treatment followed by HCl and DI rinse leaves iron on the sample, as evident from the presence of peaks at 710.65 eV and 724.25 eV, which are Fe $2p_{3/2}$ and Fe $2p_{1/2}$ peaks for ferric iron. However, in the case of CUP spin cleaning sample (PR in CHP(spin)), spin cleaning is effective in removing iron as indicated by decrease in intensity and shift of the iron peaks. Referring to (b), it can be seen that the blanket PR (blanket PR) has a C 1s peak at 284.5 eV. The C 1s peak at 284.5 eV may be ascribed to C—C bond, which is predominant in blanket PR. It is evident that CHF treatment reduces carbon level under immersion cleaning condition (PR in CHP(static)) and results in the formation of carboxyl functionalities (O—C=O) with C 1s peak located at 288.8 eV. In the spin cleaned sample (PR in CHP(spin)), only C 1s peaks characteristic of carboxyl groups are seen. In the case of the CHP followed by SPM treatment (PR in CHP+SPM)), no C 1s peaks were observed, which confirms complete removal of PR film.

Accordingly, the use of catalyzed hydrogen peroxide systems in attacking and removing implanted ($10^{16}$ As/cm$^2$) photoresist was investigated. CHP solution containing 5 mM $Fe^{2+}$ and 20% $H_2O_2$ created pores on amorphous carbon and implanted PR films. Confocal microscopy studies have shown that complete removal of PR with a crust layer was possible by treatment with CUP solution for 15 minutes followed by treatment with 2:1 SPM for 5 minutes. This particular chemical system should not be construed as limiting. Experimental variables can be optimized to reduce total process time.

Example 3

Crust Disruption Using UV/$H_2O_2$ CHP Chemical System

High dose implant resist stripping using the UV/$H_2O_2$ CHP chemical system was explored. A blanket PR exposed to arsenic ion dose of $10^{16}$/cm$^2$ was exposed to UV (254 nm) radiation for a predetermined period of time and then subjected to a $H_2O_2$ solution under UV irradiation for a second predetermined period of time. For the example embodiment, the concentration of $H_2O_2$ in the solution was 20% and the PR was treated with the solution under UV radiation for 15 minutes. The PR was then treated to a 2:1 SPM with sulfuric acid preheated to a temperature of 80° C. and mixed with hydrogen peroxide that was at about 10° C.

Figure 8A:
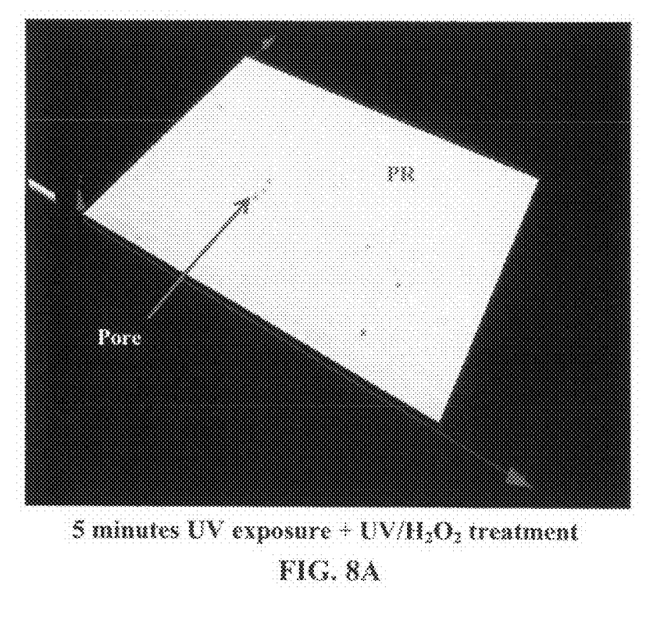
FIGS. 8A and 8B show 3D confocal images of the removal region of a substrate after 5 minutes of UV exposure and $UV/H_2O_2$ treatment (FIG. 8A) and 10 minutes of UV exposure and $UV/H_2O_2$ treatment (FIG. 8B) in accordance with embodiments of the invention.
Figure 8B:
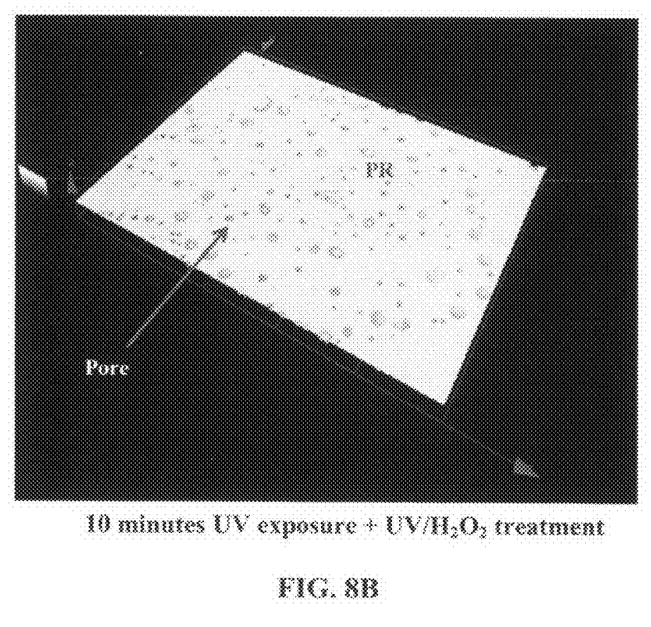

FIGS. 8A and 8B show 3D confocal images of a line scan on the removal region of a substrate after 5 minutes of UV exposure and UV/$H_2O_2$ treatment (FIG. 8A) and 10 minutes UV of exposure and UV/$H_2O_2$ treatment (FIG. 8B) in accordance with embodiments of the invention.

As illustrated by the figures, the higher the pre-exposure time to UV radiation, the more disruption appears to occur to the crust. Accordingly, certain embodiments using the UV/$H_2O_2$ system can include a UV pre-exposure step. Of course, this step may be omitted.

The crust disruption and resist removal can be optimized via modifying the UV intensity, $H_2O_2$ concentration, treatment time (both pre-treatment UV exposure time and UV irradiated $H_2O_2$ treatment time), and system temperature.

For example, UV (254 nm) intensity can be 1 to 12.2 mW/cm$^2$, $H_2O_2$ concentration can be between 1-20%.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

We claim:

1. A method of stripping implanted resist, the method comprising:
    disrupting a crust on a resist to expose at least a portion of underlying resist by applying a catalyzed hydrogen peroxide propagation (CHP) chemical system, wherein the CHP chemical system comprises about 5-25% $H_2O_2$; and
    removing the underlying resist by applying an etchant to the resist after disrupting the crust.

2. The method according to claim 1, wherein the resist is a deep UV resist.

3. The method according to claim 1, wherein a catalyst of the CHP chemical system is iron.

4. The method according to claim 1, wherein a catalyst of the CHP chemical system is UV radiation.

5. The method according to claim 1, wherein a catalyst of the CHP chemical system is sonic waves.

6. The method according to claim 1, wherein the CHP chemical system is applied at room temperature.

7. The method according to claim 1, wherein the application of the CHP chemical system comprises immersing a wafer having the resist into the CHP chemical system.

8. The method according to claim 1, wherein the application of the CHP chemical system comprises applying the CHP chemical system while a wafer having the resist is moving.

9. The method according to claim 8, wherein the applying of the CHP chemical system uses an aerosolized spray.

10. The method according to claim 1, wherein the application of the CHP chemical system comprises applying a solution comprising the about 5-25% hydrogen peroxide by a spin processing method while irradiating with UV light or applying sonic waves.

11. The method according to claim 1, wherein removing the underlying resist by applying the etchant to the resist after disrupting the crust comprises:
    applying a sulfuric acid-peroxide mixture (SPM) after applying the CHP chemical system.

12. The method according to claim 11, wherein the SPM is applied by immersion.

13. The method according to claim 11, wherein the SPM is applied while a wafer having the underlying resist is moving.

14. The method according to claim 11, wherein the SPM is heated to a temperature of less than 180° C. before applying the SPM.

15. The method according to claim 11, wherein sulfuric acid of the SPM is heated to a temperature of about 80° C. before applying the SPM.

16. A method of fabricating a semiconductor device using deep UV lithography, the method comprising:
    implanting ions at a dose of at least $10^{15}/cm^2$ into a wafer having a deep UV resist pattern thereon; and
    stripping the implanted deep UV resist pattern, wherein stripping the implanted deep UV resist pattern comprises:
    using a CHP chemical system to disrupt a crust formed on the deep UV resist during the implanting of the ions, wherein the CHP chemical system comprises about 5-25% $H_2O_2$; and
    removing the deep UV resist underlying the disrupted crust by applying a sulfuric acid-peroxide mixture (SPM) after disrupting the crust using the CHP chemical system.

17. The method according to claim 16, wherein using the CHP chemical system comprises applying a solution comprising the about 5-25% $H_2O_2$ and 0-10 mM $Fe^{2+}$ to the wafer.

18. The method according to claim 17, wherein using the CHP chemical system further comprises irradiating the wafer with UV light or sonic waves.

19. The method according to claim 17, wherein using the CHP chemical system further comprises irradiating the wafer with UV light before and during applying the solution to the wafer.

* * * * *

UNITED STATES PATENT AND TRADEMARK OFFICE
CERTIFICATE OF CORRECTION

PATENT NO. : 8,772,170 B2  
APPLICATION NO. : 12/981073  
DATED : July 8, 2014  
INVENTOR(S) : Raghavan et al.

Page 1 of 1

It is certified that error appears in the above-identified patent and that said Letters Patent is hereby corrected as shown below:

In the Specification

Column 1,  
Line 26, "asking)" should read --ashing)--.

Column 2,  
Line 51, "with CLIP for" should read --with CHP for--.

Column 3,  
Line 15, "(OH., HO$_2$.)" should read --(OH$^{\cdot}$, HO$_2^{\cdot}$)--.  
Line 17, "Fe$^{2+}$+H$_2$O$_2$ → Fe$^{3+}$ + OH.+OH" should read --Fe$^{2+}$ + H$_2$O$_2$ → Fe$^{3+}$ + OH$^{\cdot}$ + OH$^-$--.  
Line 19, "Fe$^{3+}$+H$_2$O$_2$ → Fe$^{2+}$ + OOH.+H$^+$" should read --Fe$^{3+}$ + H$_2$O$_2$ → Fe$^{2+}$ + OOH$^{\cdot}$ + H$^+$--.  
Line 53, "5100" should read --S100--.  
Line 55, "5100" should read --S100--.

Column 5,  
Line 65, "CUP" should read --CHP--.

Column 6,  
Line 21, "Hitachi 54800" should read --Hitachi S4800--.

Column 7,  
Line 13, "CLIP" should read --CHP--.

Column 8,  
Line 1, "CUP" should read --CHP--.  
Line 7, "CHF" should read --CHP--.  
Line 22, "CUP" should read --CHP--.

Signed and Sealed this  
Ninth Day of December, 2014

Michelle K. Lee  
*Deputy Director of the United States Patent and Trademark Office*